United States Patent
Inoue et al.

(10) Patent No.: US 6,606,780 B1
(45) Date of Patent: Aug. 19, 2003

(54) MERCURY-CONTAINING COPPER OXIDE SUPERCONDUCTOR AND METHOD OF PRODUCING SAME

(75) Inventors: Nobuyoshi Inoue, Tokyo (JP); Tsuyoshi Sugano, Tokyo (JP); Seiji Adachi, Tokyo (JP); Keiichi Tanabe, Tokyo (JP)

(73) Assignees: International Superconductivity Technology Center (JP); The Chugoku Electric Power Co., Inc. (JP)

( * ) Notice: Subject to any disclaimer, the term of this patent is extended or adjusted under 35 U.S.C. 154(b) by 258 days.

(21) Appl. No.: 09/649,051

(22) Filed: Aug. 29, 2000

(30) Foreign Application Priority Data

Aug. 30, 1999 (JP) ............................................. 11-242418

(51) Int. Cl.⁷ ............................................... H01L 39/24
(52) U.S. Cl. ........................... 29/599; 505/125; 505/473
(58) Field of Search .................. 29/599, 722; 505/125, 505/473

(56) References Cited

U.S. PATENT DOCUMENTS

| | | | | | |
|---|---|---|---|---|---|
| 5,462,921 A | * | 10/1995 | Adachi et al. | ............... | 505/473 |
| 5,578,551 A | * | 11/1996 | Chu et al. | .................... | 505/125 |
| 5,858,926 A | * | 1/1999 | Schwartz et al. | ........... | 505/125 |
| 5,883,050 A | * | 3/1999 | Yun et al. | .................... | 505/125 |
| 6,395,685 B1 | * | 5/2002 | Wu et al. | .................... | 505/473 |

* cited by examiner

Primary Examiner—David P. Bryant
(74) Attorney, Agent, or Firm—Lorusso, Loud & Kelly

(57) ABSTRACT

A superconductor having at least one Hg—M—Cu—O (M=Ba, Sr and/or Ca) superconducting film provided on a substrate and having a thickness of between 300 Å to 950 Å. The superconductor may be prepared by forming, on a substrate, a precursor laminate composed of a first, M—Cu—O film and a second, Hg—O film. The precursor laminate film-bearing substrate is placed in a closed vacuum chamber together with a first pellet of HgO, MO and CuO and a second pellet of MO and CuO. The contents in the chamber are heated to form, on the substrate, a superconducting Hg—M—Cu—O film. The thickness of the first M—Cu—O film of the precursor is controlled so that the thickness of the superconducting Hg—M—Cu—O film is in the range of between 300 Å to 950 Å.

6 Claims, 6 Drawing Sheets

MERCURY-CONTAINING COPPER OXIDE SUPERCONDUCTOR AND METHOD OF PRODUCING SAME

CROSS-REFERENCE TO RELATED APPLICATIONS

This application claims, under 35 USC 119, priority of Japanese Application No. 11-242418 filed Aug. 30, 1999.

BACKGROUND OF THE INVENTION

This invention relates to a mercury-containing copper oxide superconductor having a high superconducting transition temperature.

Because superconductors have unique characteristics that (1) the electrical resistivity is zero, (2) they show perfect diamagnetism and (3) they show Josephson effect, superconductors are anticipated for utilization in various applications such as electric power transmission, electric generators, nuclear fusion plasma containment, magnetic levitation trains, magnetic shield and high speed computers.

An oxide superconductor ($La_{1-x}Ba_x)_2CuO_4$ having a high superconducting transition temperature Tc of about 30 K was found by Bendonorz and Muller in 1986. Since then, reports have been successively made on superconducting transition at high temperatures in connection with $YBa_2Cu_3O_x$ (Tc=90 K), $Bi_2Sr_2Ca_2Cu_3O_y$ (Tc=110 K) $Tl_2Ba_2Ca_2Cu_3O_z$ (Tc=125 K) and $HgBa_2Ca_2Cu_3O_z$ (Tc=135 K) A number of studies are now being made on the method of preparation, physical properties and application of these substances. In particular, mercury-containing copper oxide superconductors are considered to be promising because of their high superconducting transition temperature.

In order to practically use a copper oxide superconductor, it is important that the superconductor have a shape suitable for its utilization. For the utilization in electronic devices, for example, development of film forming techniques for superconductors is essential. Studies on the formation of mercury-containing copper oxide superconductor films have been extensively made all over the world since 1993 in which a mercury-containing copper oxide superconductor was first found.

A process for the preparation of a mercury-containing copper oxide superconductor film having Tc of 100K or more is known in which a precursor film composed of constituent elements is first prepared and then heat treated in the presence of mercury (Y. Q. Wang et al., Appl. Phys. Lett. 63 (1993) 3084).

A physical vacuum deposition method such as RF sputtering or pulsed laser ablation (PLD) is generally adopted for the production of the precursor film. When the precursor film is exposed to air, Ba contained therein reacts with moisture and carbon dioxide, which considerably adversely affect the formation of a desired mercury-containing copper oxide superconductor film. To prevent such a reaction, a mercury oxide film is generally provided over the precursor film (C. C. Tsuei et al., Science 263 (1994) 1259).

In the heat treatment, the precursor film is placed in a vacuum quartz tube together with pellets of Hg—Ba—Ca—Cu—O for the purpose of controlling the mercury vapor pressure. The heat treatment is performed at about 800° C. under vacuum to obtain a mercury-containing copper oxide superconductor film having Tc of 130 K or more (W. N. Kang et al., Appl. Phys. Lett. 73 (1998) 381).

A mercury-containing copper oxide superconductor film having a critical current density Jc of about $10^6$ A/cm$^2$ or more at 77 K is also reported (S. L. Yan et al., Appl. Phys. Lett. 73 (1998) 2989).

As an application to an electronic device, a superconducting quantum interference device (SQUID) using a mercury-containing copper oxide superconductor film having a thickness of 2000 Å is reported (A. Tsukamoto et al., Appl. Phys. Lett. 73 (1988) 990). The junction is reported to have Jc of $4×10^3$ to $6×10^4$ A/cm at 77 K and IcRn of 450 $\mu$V which is greater than IcRn values of currently most widely studied Y123 type superconductors (200 to 300 $\mu$V). Further, the SQUID is reported as operable at 111 K. These characteristics suggest high potential of mercury-containing copper oxide superconductors.

A mercury-containing copper oxide superconductor is a layer compound. The crystal grain has a plate-like shape as illustrated in FIG. 3. A desired superconductor film is composed of c-axis oriented plate-like crystals 11A continuously arranged on a substrate 10. However, it has been found that known mercury-containing copper oxide superconductor film has a number of defects. Thus, as shown in FIGS. 4(a)–4(c), there are steps 13, holes 14 and gaps 15 in known films. The defects also include outgrowths whose crystal orientations are not uniform (see FIG. 6). These defects cause a reduction of Jc as well as variation of superconductive characteristics at different locations of the film and interfere the fabrication of electronic devices.

SUMMARY OF THE INVENTION

It is an object of the present invention to provide a mercury-containing copper oxide superconductor film free of the above-described defects.

Another object of the present invention is to provide a superconductor film of the above-mentioned type which has a desired thickness.

It is a further object of the present invention is to provide a superconductor film of the above-mentioned type which has two or more mercury-containing copper oxide superconductor layers having different compositions so that the superconductive characteristics of the film is modulated.

It is a further object of the present invention to provide a method which can prepare the above mercury-containing copper oxide superconductor film.

In accomplishing the foregoing object, the present invention provides a superconductor having a substrate, and a superconducting film provided on the substrate and having a thickness in the range of between 300 Å to 950 Å, wherein the superconducting film contains Hg, M which is Ba, Sr or Ca, Cu and O.

The present invention also provides a method of producing a superconductor, which includes the steps of:

(a) forming, on a substrate, a precursor laminate film having a first film containing M which is Ba, Sr or Ca, Cu and O and a second, mercury oxide film provided on the first film;

(b) placing the precursor laminate film-bearing substrate in a closed vacuum chamber together with a first pellet containing Hg, M which is as defined above, Cu and O and a second pellet containing M which is as defined above, Cu and O; and (c) heating the precursor laminate film-bearing substrate, the first and second pellets in the vacuum chamber to form, on the substrate, a superconducting film having a thickness in the range of between 300 Å to 950 Å and containing Hg, M, Cu and O.

The mechanism by which the known mercury-containing copper oxide superconductor film is formed is considered to be as follows.

As shown in FIG. 5(a), a substrate 10 on which a precursor film consisting of a M—Cu—O layer and a Hg—O layer is provided is placed in a vacuum chamber together with pellets. Then, the contents in the chamber are heated so that a mercury-containing copper oxide superconductor film having a thickness of 1000 Å or more is formed on the substrate. As shown in FIG. 5(b), a liquid phase 12 composed of Hg, M, Cu and O is formed during the heat treatment. Seed crystals are formed in the liquid phase 12 and grow gradually. In the region adjacent to the surface of the substrate 10 where the surface tension of the liquid phase 12 effectively acts on the growing crystal grains, the c-axis thereof orient in the direction normal to the substrate. However, crystal grains 11 A growing in the region remote from the surface of the substrate 10 orient at random. As a consequence, as shown in FIG. 6, there are formed steps 13, holes 14, gaps 15 and outgrowths 16.

In contrast, the superconductor film according to the present invention is considered to be produced as follows.

As shown in FIG. 1(a), a substrate 10 on which a precursor film 11B having a thickness smaller than the above and consisting of a M—Cu—O layer and a Hg—O layer is provided is used. The precursor film-bearing substrate is placed in a vacuum chamber together with pellets. Then, the contents in the chamber are heated. As shown in FIG. 1(b), a liquid phase 12 composed of Hg, M, Cu and O is formed during the heat treatment. Seed crystals are formed in the liquid phase 12 and grow gradually. Since a the precursor film 11B is thin, most of crystal grains grow in the region adjacent to the surface of the substrate 10. Thus, the orientation of the crystal grains receives a strong influence of the crystal orientation of the substrate 10. Accordingly, the c-axis thereof orient in the direction normal to the surface of the substrate, with the a-axis thereof being oriented in the direction corresponding to the crystal orientation of the substrate 10. Moreover, since the liquid phase 12 can effectively wet both the surface of substrate and the crystal grains in contact therewith, the crystal grains grow in the lateral direction in an enhanced manner. Thus, as shown in FIG. 1(c), the mercury-containing copper oxide superconductor film 11 is free of steps, holes, gaps and outgrowths and is flat and uniform. Further, the crystal grains are tightly connected with each other.

BRIEF DESCRIPTION OF THE DRAWINGS

Other objects, features and advantages of the present invention will become apparent from the detailed description of the preferred embodiments of the invention which follows, when considered in the light of the accompanying drawings, in which.

DETAILED DESCRIPTION OF THE PREFERRED EMBODIMENTS OF THE INVENTION

Figure 1A:
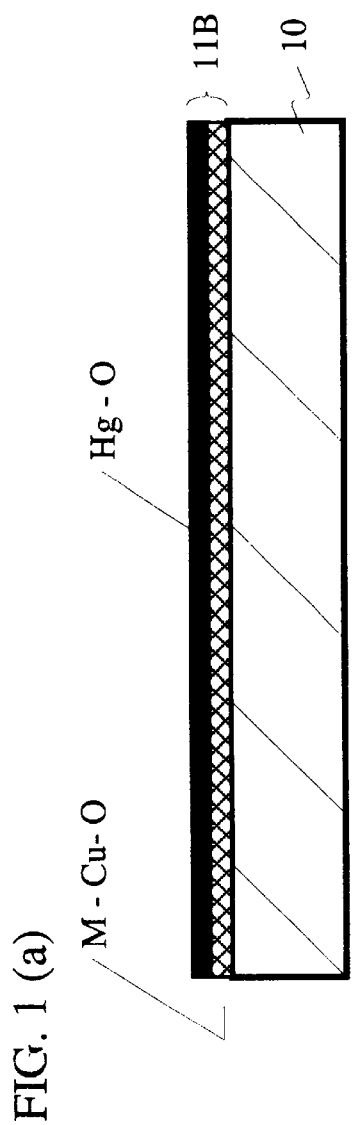
FIGS. 1(a) through 1(c) are sectional views schematically illustrating a process of growing a mercury-containing copper oxide superconductor film on a substrate according to the present invention.
Figure 1B:
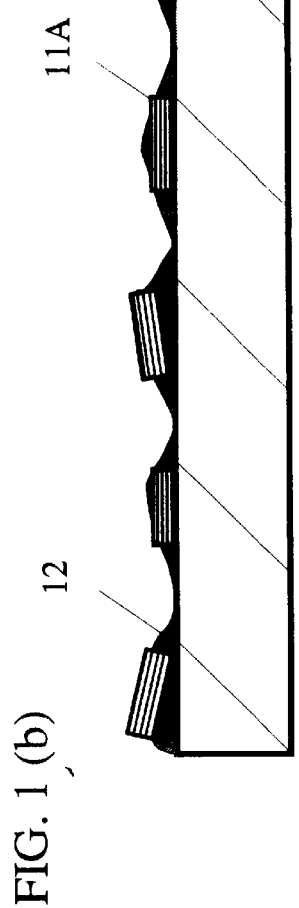
Figure 1C:
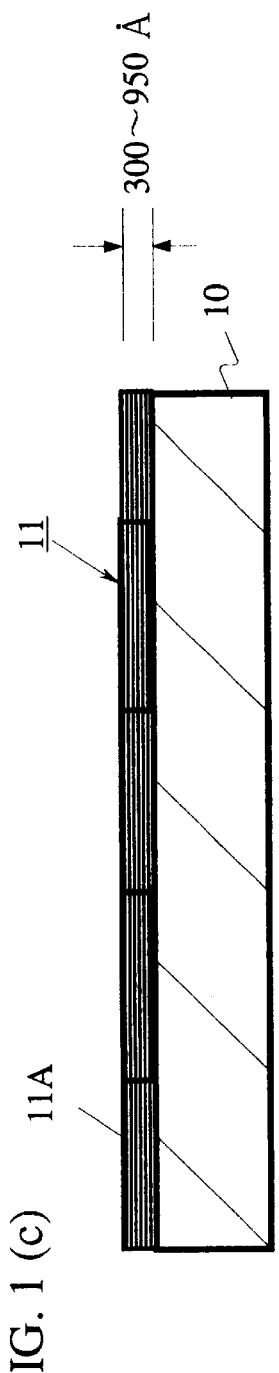

Referring to FIG. 1(c), a superconductor according to the present invention includes a substrate 10, and a mercury-containing copper oxide superconductor film 11 provided thereon.

Any customarily employed substrate may be used for the purpose of the present invention. Examples of suitable substrate include $SrTiO_3$, $LaAlO_3$, $(LaAlO_3)_{0.3} \cdot (Sr_2AlTaO_6)_{0.7}$, $NdGaO_3$, $YAlO_3$, Y-stabilized $ZrO_2$ and MgO. The mercury-containing copper oxide superconductor film contains Hg, M (=Ba, Sr and/or Ca), Cu and O. Examples of mercury-containing copper oxide superconductors include $HgM_3Cu_2O_y$ (y=6.10–6.31) and $HgM_4Cu_3O_z$ (z=8.17–8.30) where M is as defined above.

It is important that the mercury-containing copper oxide superconductor film should have a thickness in the range of between 300 Å to 950 Å.

Because the superconductor according to the present invention is free of surface defects, the critical current density Jc thereof is high. Preferably, the superconductor according to the present invention has a critical current density Jc at 77 K of at least $8 \times 10^6$ A/cm$^2$.

The superconductor may be produced as follows.

First, as shown in FIG. 1(a), a precursor laminate film 11B having a first film containing M, Cu and O and a second, mercury oxide film covering thereon is formed on a substrate 10 (step (a)). The precursor laminate film-bearing substrate is then placed in a closed vacuum chamber together with a first pellet containing Hg, M, Cu and O and a second pellet containing M, Cu and O (step (b)). The contents in the vacuum chamber are heated to form, on the substrate 10, a superconducting film 11 containing Hg, M, Cu and O (step (c)).

In the above process, it is important that the thickness of the first film containing M, Cu and O of the precursor film 11B should be controlled so that the superconducting film 11 has a thickness in the range of between 300 Å to 950 Å.

Figure 2:
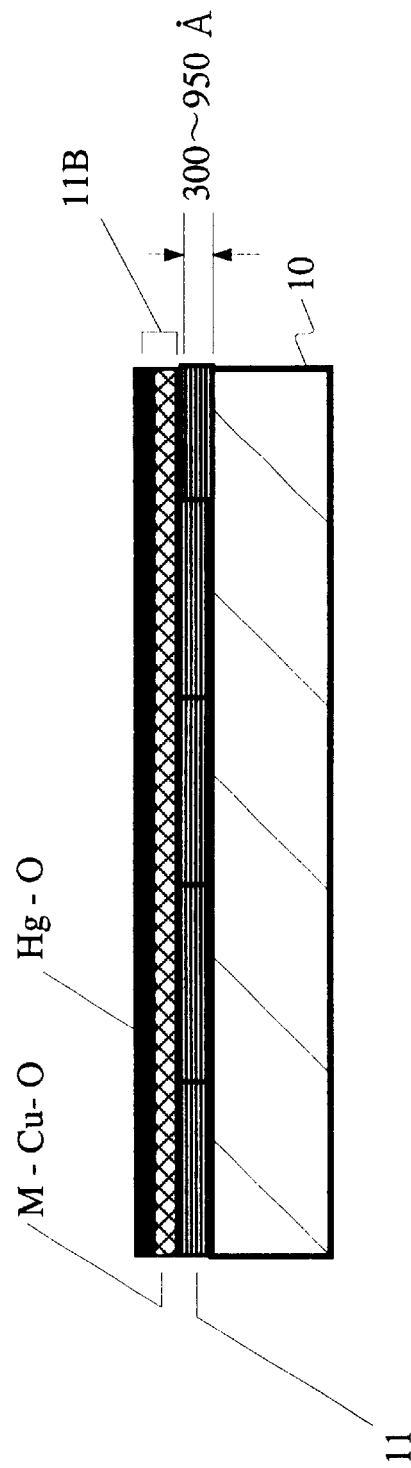
FIGS. 2(a) and 2(b) are sectional views similar to FIGS. 1(a) and 1(c), respectively, schematically illustrating a process of growing a mercury-containing copper oxide superconductor film by repeating procedures according to the present invention.
Figure 2:
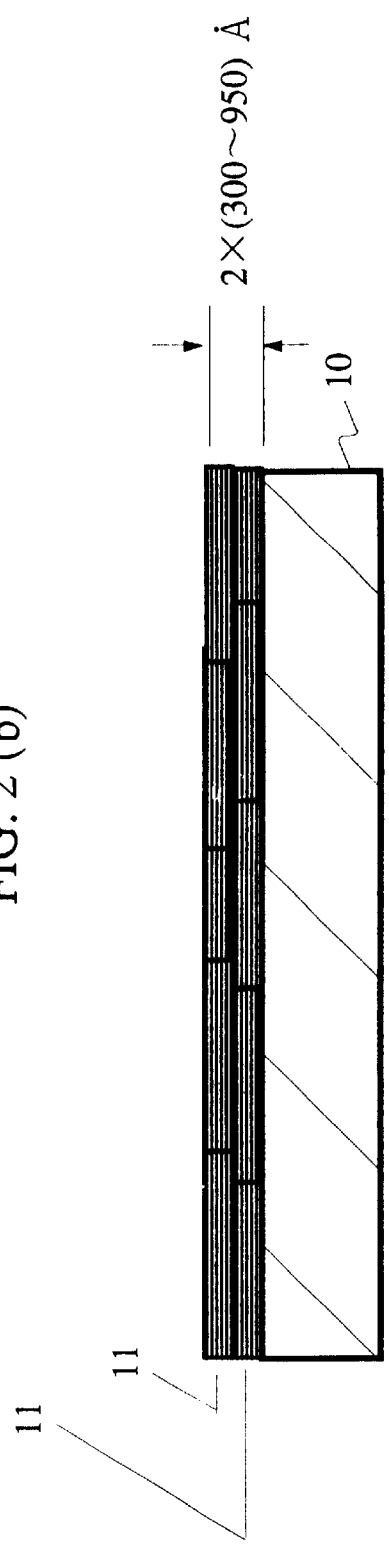
Figure 3:
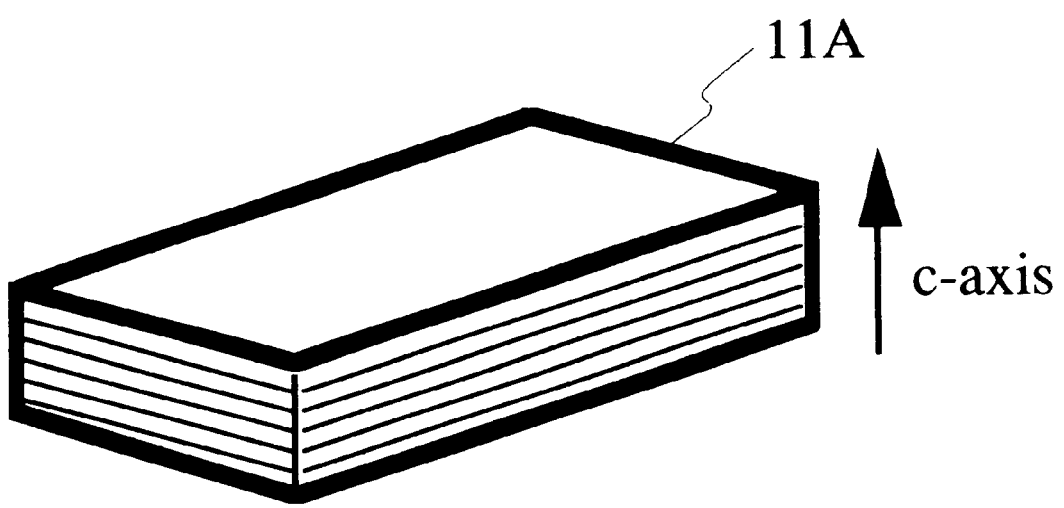
FIG. 3 is a perspective view schematically illustrating a crystal grain of a mercury-containing copper oxide superconductor.
Figure 4A:
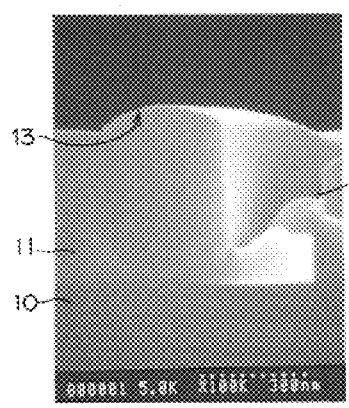
FIGS. 4(a) through 4(c) are SEM photographs of sections of known mercury-containing copper oxide superconductor films.
Figure 4B:
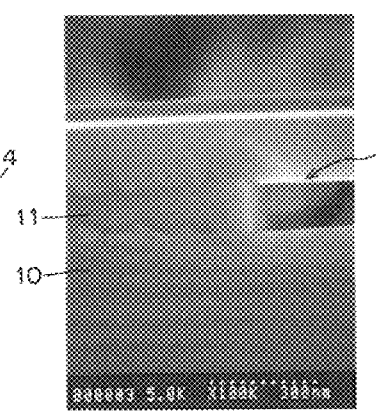
Figure 4C:
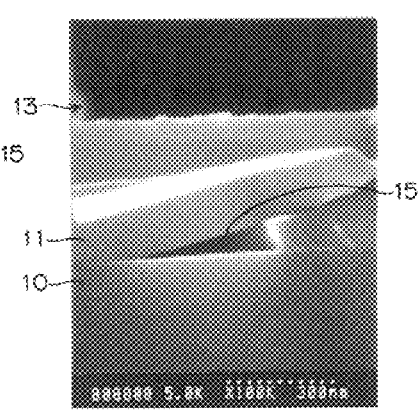
Figure 5A:
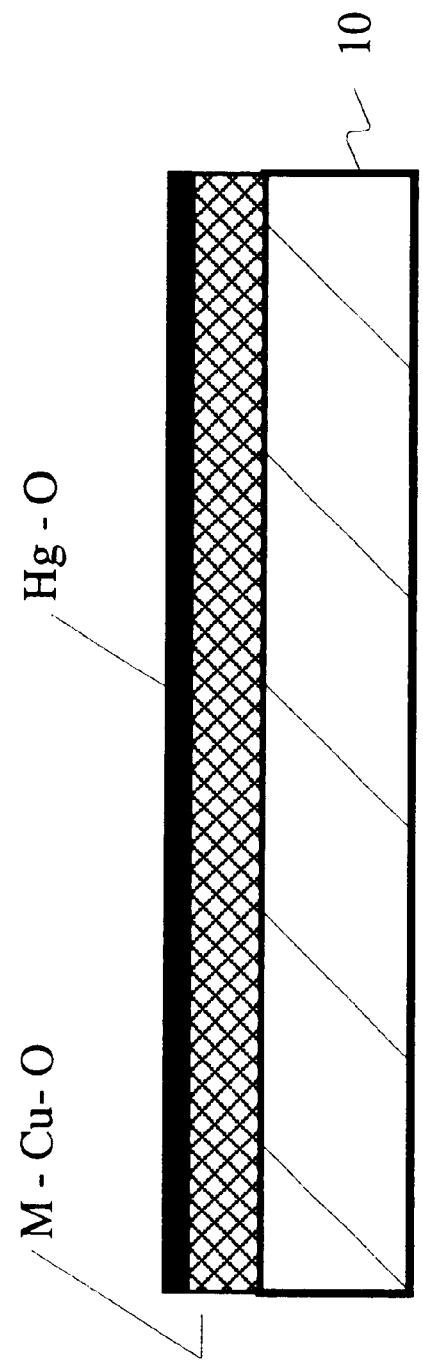
FIGS. 5(a) and 5(b) are sectional views similar to FIGS. 1(a) and 1(b), respectively, schematically illustrating a process of growing a known mercury-containing copper oxide superconductor film.
Figure 5B:
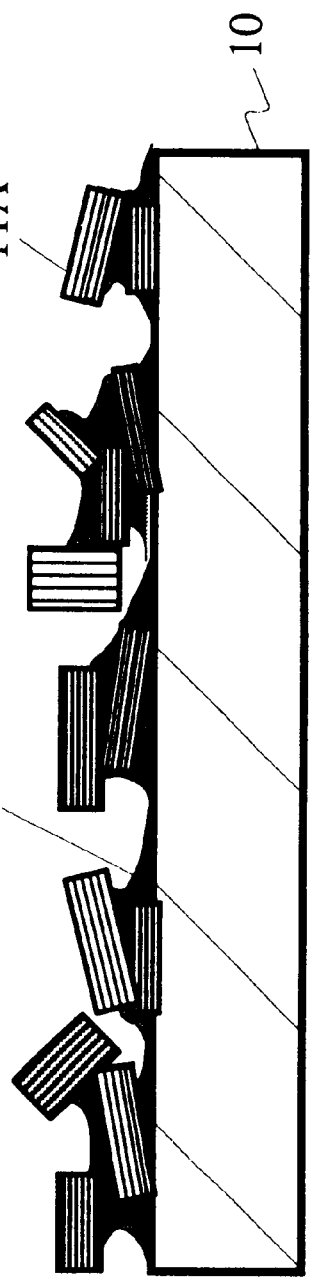
Figure 6:
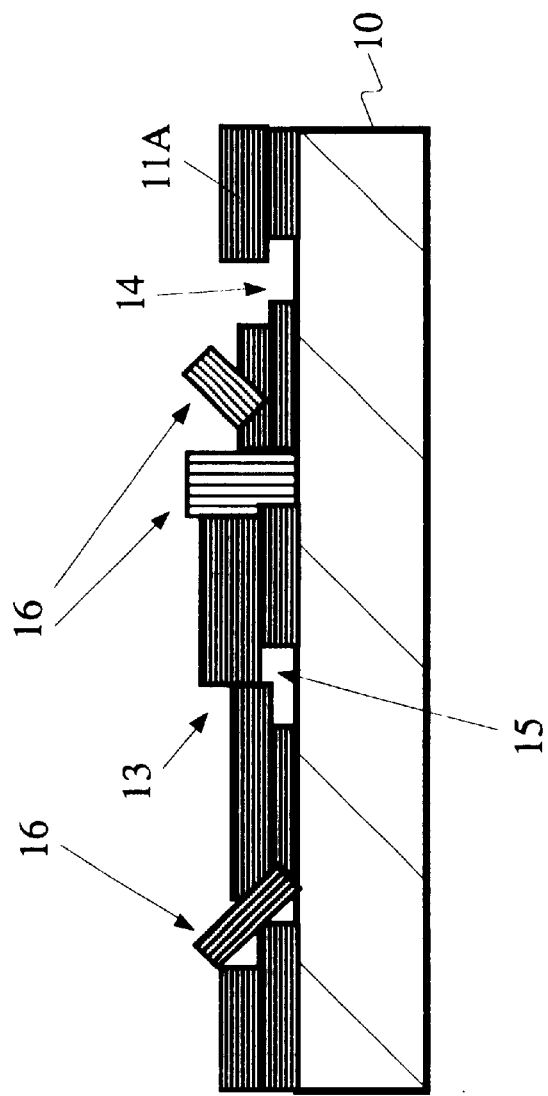
FIG. 6 is a sectional view similar to FIG. 1(c) schematically illustrating a known mercury-containing copper oxide superconductor film.

In another embodiment shown in FIG. 2(b), the superconductor according to the present invention includes a substrate 10, and a superconducting laminate film provided on the substrate. The laminate film includes at least two superconducting layers 11 each having a thickness in the range of between 300 Å to 950 Å. Each of the superconducting layers 11 contains Hg, M (Ba, Sr and/or Ca), Cu and O. The compositions of the layers 11 may be the same or different. Examples of mercury-containing copper oxide superconductors include $HgM_3Cu_2O_y$ and $HgM_4Cu_3O_z$ where M, y and z are as defined previously.

The superconductor having the superconducting laminate film may be prepared by repeating a cycle of the above steps (a) through (c). Thus, the product obtained in step (c) of the first cycle is used as the substrate for step (a) of the second cycle, as shown in FIG. 2(a). Steps (b) and (c) are then performed to form two superconducting layers 11 on the substrate 10 as shown in FIG. 2(b). The cycle including the steps (a)–(c) is repeated until a laminate superconducting film has a desired thickness.

When the precursor laminate film and the first and second pellets used in respective cycles are the same, the superconducting layers have the same composition. If desired, different the precursor laminate film and the first and second pellets may be used in respective cycles. In this case, the superconducting layers have different compositions.

The following examples will further illustrate the present invention.

EXAMPLE 1

On a $SrTiO_3$ (100) substrate, a $Ba_2CaCu_2O_y$ film and a HgO film were formed by PLD to obtain a precursor laminate film-bearing substrate. The thicknesses of the $Ba_2CaCu_2O_y$ and HgO films were 1000 Å and 500 Å, respectively. This was then placed in a quartz tube together with a first pellet composed of a mixture of HgO powder, BaO powder, CaO powder and CuO powder with a molar ratio of 1:2:1:2 and a second pellet composed of a mixture of BaO powder, CaO powder and CuO powder with a molar ratio of 2:1:2. After the quartz tube had been made vacuum and closed, the contents in the quartz tube were heated at 700–800° C., thereby obtaining a superconductor having a $HgBa_2CaCu_2O_y$ film on the substrate. The X-ray diffraction analysis revealed that the film was biaxially oriented film with its c-axis and a-axis being uniformly oriented. The film was also measured for its temperature dependency of the resistance, revealing that the resistance became zero at 116 K or lower. A scanning secondary electron microscope (SEM) of a surface and a cross section of the film did no reveal any steps, holes, gaps or outgrowths. The thickness of the film was found to be 750 Å. The superconductor had a Jc at 77 K of $1.02 \times 10$ $A/cm^2$. Variation of Jc of the superconductor at different positions was about 10%. The AFM (atomic force microscope) observation revealed that the average roughness Ra of the superconducting film in an area of 10 μm×8 μm was 29.0 Å and that the maximum surface roughness was 100.2 Å (13% of the thickness).

EXAMPLES 2–12 AND COMPARATIVE EXAMPLES 1–4

Example 1 was repeated in the same manner as described except that the thicknesses of the films were changed as shown in Table 1. The thickness, results of SEM observation, Tc and Jc of each of the superconducting films thus obtained are summarized in Table 1 together with those of Example 1.

TABLE 1

| Example No. | Thickness $Ba_2CaCu_2O_y$/ HgO (Å) | Thickness of superconducting Film (Å) | SEN Analysis | Tc (K) | Jc at 77 K (× $10^6$ $A/cm^2$) |
|---|---|---|---|---|---|
| Comp. 1 | 100/500 | — | islands | — | — |
| Comp. 2 | 200/500 | — | islands | — | — |
| 2 | 400/500 | 300 | no defects | 118 | 9.12 |
| 3 | 600/500 | 450 | no detects | 117 | 9.56 |
| 4 | 800/500 | 600 | no defects | 117 | 10.00 |
| 1 | 1000/500 | 750 | no defects | 116 | 10.20 |
| 5 | 1200/500 | 900 | no defects | 118 | 8.99 |
| Comp. 3 | 1400/500 | 1050 | holes, outgrowths | 119 | 5.99 |
| Comp. 4 | 1600/500 | 1200 | holes, outgrowths | 119 | 5.85 |
| 6 | 900/200 | 700 | no defects | 118 | 9.56 |
| 7 | 900/400 | 700 | no defects | 116 | 8.67 |
| 8 | 900/600 | 700 | no defects | 117 | 9.88 |
| 9 | 900/800 | 700 | no defects | 116 | 9.12 |

TABLE 1-continued

| Example No. | Thickness $Ba_2CaCu_2O_y$/ HgO (Å) | Thickness of superconducting Film (Å) | SEN Analysis | Tc (K) | Jc at 77 K (× $10^6$ $A/cm^2$) |
|---|---|---|---|---|---|
| 10 | 900/1000 | 700 | no defects | 117 | 9.46 |
| 11 | 900/1200 | 700 | no defects | 119 | 10.00 |
| 12 | 900/1400 | 700 | no defects | 118 | 9.34 |

EXAMPLES 13–17 AND COMPARATIVE EXAMPLES 5–8

Example 1 was repeated in the same manner as described except that the PLD was replaced by RF sputtering for the formation of precursor films and that the thicknesses of the films were changed as shown in Table 2. The thickness, results of SEM observation, Tc and Jc of each of the superconducting films thus obtained are summarized in Table 2.

TABLE 2

| Example No. | Thickness $Ba_2CaCu_2O_y$/ HgO (Å) | Thickness of superconducting Film (Å) | SEN Analysis | Tc (K) | Jc at 77 K (× $10^6$ $A/cm^2$) |
|---|---|---|---|---|---|
| Comp. 5 | 200/500 | — | islands | — | — |
| Comp. 6 | 400/500 | — | islands | — | — |
| 13 | 600/500 | 400 | no defects | 115 | 9.85 |
| 14 | 800/500 | 550 | no defects | 113 | 10.10 |
| 15 | 1000/500 | 700 | no defects | 114 | 10.00 |
| 16 | 1200/500 | 850 | no defects | 116 | 9.95 |
| 17 | 1400/500 | 950 | no defects | 114 | 8.56 |
| Comp. 7 | 1600/500 | 1100 | outgrowths | 117 | 5.98 |
| Comp. 8 | 1800/500 | 1250 | holes, outgrowths | 118 | 4.86 |

From the results shown in Tables 1 and 2, it will be appreciated that superconducting films having no defects and a high Jc are obtained when the thickness thereof is between 300–950 Å. C-axis oriented $HgBa_2CaCu_2O_y$ films having flat surfaces were obtained in Examples 1–17. When the thickness of the $Ba_2CaCu_2O_y$ film of the precursor laminate film was too thin to obtain a $HgBa_2CaCu_2O_y$ film with a thickness of 300 Å or more (Comparative Examples 1, 2, 5 and 6), crystal grains on the substrate failed to provide a film but only formed islands. Thus, no Tc and Jc were measurable. On the other hand, when the thickness of the $Ba_2CaCu_2O_y$ film of the precursor laminate film was too thick to obtain a $HgBa_2CaCu_2O_y$ film with a thickness of 950 Å or less (Comparative Examples 3, 4, 7 and 8), surface defects were produced so that Jc was below $6 \times 10^6$ $A/cm^2$. The results shown in Tables 1 and 2 also indicate that the thickness of HgO film of the precursor laminate does not give any significant influence upon the superconducting films.

EXAMPLE 18

On the superconductor obtained in Example 1, a $HgBa_2CaCu_2O_y$ film (second layer) was additionally formed. Thus, on the $HgBa_2CaCu_2O_y$ film (first layer) prepared on the substrate in Example 1, a $Ba_2CaCu_2O_y$ film and a HgO film were formed by PLD to obtain a precursor laminate film-bearing substrate. The thicknesses of the $Ba_2CaCu_2O_y$ and HgO films were 1000 Å and 500 Å, respectively. This was then placed in a quartz tube together with a first pellet composed of a mixture of HgO powder, BaO powder, CaO powder and CuO powder with a molar ratio of 1:2:1:2 and a second pellet composed of a mixture of BaO powder, CaO powder and CuO powder with a molar ratio of 2:1:2. After the quartz tube had been made vacuum and closed, the contents in the quartz tube were heated at 700–800° C., thereby obtaining a superconductor having a laminate $HgBa_2CaCu_2O_y$ film on the substrate. The X-ray diffraction analysis revealed that the film was biaxially oriented film with its c-axis and a-axis being uniformly oriented. The film was found to have Tc of 120 K. No steps, holes, gaps or outgrowths were observed by SEM. The thickness of the film was found to be 1450 Å. No boundary was determinable between the first and second layers of the film because they were closely united and integrated into a unitary film. The superconductor had a Jc at 77 K of $6.54 \times 10^6$ A/cm$^2$.

EXAMPLE 19

On the superconductor obtained in Example 18, a $HgBa_2CaCu_2O_y$ film (third layer) was additionally formed. Thus, on the $HgBa_2CaCu_2O_y$ film (second layer) prepared in Example 18, a precursor laminate was formed. This was treated in the same manner as that in Example 1 to form a $HgBa_2CaCu_2O_y$ laminate film on the substrate. The X-ray diffraction analysis revealed that the film was biaxially oriented film with its c-axis and a-axis being uniformly oriented. The film was found to have Tc of 122 K. No steps, holes, gaps or outgrowths were observed by SEM. The thickness of the film was found to be 2100 Å. No boundary was determinable between the second and third layers of the film. The superconductor had a Jc at 77 K of $5.68 \times 10^6$ A/cm$^2$.

EXAMPLE 20

On the superconductor obtained in Example 1, a $HgBa_2Ca_2Cu_3O_z$ film (second layer) was additionally formed. Thus, on the $HgBa_2CaCu_2O_y$ film (first layer) prepared on the substrate in Example 1, a $Ba_2Ca_2Cu_3O_z$ film and a HgO film were formed by PLD to obtain a precursor laminate film-bearing substrate. The thicknesses of the $Ba_2CaCu_2O_y$ and HgO films were 1000 Å and 500 Å, respectively. This was then placed in a quartz tube together with a first pellet composed of a mixture of HgO powder, BaO powder, CaO powder and CuO powder with a molar ratio of 1:2:2:3 and a second pellet composed of a mixture of BaO powder, CaO powder and CuO powder with a molar ratio of 2:2:3. After the quartz tube had been made vacuum and closed, the contents in the quartz tube were heated at 770–840° C., thereby obtaining a superconductor having a c-axis oriented laminate film composed of first, $HgBa_2CaCu_2O_y$ layer and second, $HgBa_2Ca_2Cu_3O_z$ layer provided the substrate. The film was found to have Tc of 131 K. No steps, holes, gaps or outgrowths were observed by SEM. The thickness of the film was found to be 1260 Å. No boundary was determinable between the first and second layers of the film because they were closely united and integrated into a unitary film.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

The teachings of Japanese Patent Application No. H11-242418, filed Aug. 30, 1999, inclusive of the specification, claims and drawings, are hereby incorporated by reference herein.

What is claimed is:

1. A method of producing a superconductor, comprising the steps of:

(a) forming, on a substrate, a precursor laminate film having a first film containing (1) M, which is at least one element selected from the group consisting of Ba, Sr and Ca, (2) Cu and (3) O and a second, mercury oxide film provided on said first film;

(b) placing said precursor laminate film-bearing substrate in a closed vacuum chamber together with a first pellet containing Hg, M which is as defined above, Cu and O and a second pellet containing M which is as defined above, Cu and O; and (c) heating said precursor laminate film-bearing substrate and said first and second pellets in said vacuum chamber to form, on said substrate, a superconducting film having a thickness in the range of between 300 Å to 950 Å and containing Hg, M, Cu and O.

2. A method as claimed in claim 1, further comprising repeating steps (a) through (c) using the product obtained in step (c) as said substrate in step (a) until laminated superconducting films have a desired thickness.

3. A method as claimed in claim 2, wherein said first and second films and said first and second pellets used in respective repetition are the same so that the laminated superconducting films have the same composition.

4. A method as claimed in claim 2, wherein said first and second films and said first and second pellets used in respective repetition are different so that the laminated superconducting films have different compositions.

5. A method as claimed in claim 1 wherein the thickness of the first film is within the range of 400–1400 Å and wherein the thickness of the second film is within the range of 200–1400 Å.

6. A method as claimed in claim 5 wherein the first film is $Ba_2CaCu_2O_y$ and the second film is HgO.

* * * * *

UNITED STATES PATENT AND TRADEMARK OFFICE
CERTIFICATE OF CORRECTION

PATENT NO. : 6,606,780 B1
DATED : August 19, 2003
INVENTOR(S) : Inoue et al.

It is certified that error appears in the above-identified patent and that said Letters Patent is hereby corrected as shown below:

Column 5,
Line 33, "1.02 X 10  A/cm$^2$" should read -- 1.02 X 10$^7$  A/cm$^2$ --; and
Line 38, "Å(13%" should read -- Å (13% --.

Column 6,
Table 1, Table 1-continued and Table 2, fourth column, "SEN" should read -- SEM --.

Signed and Sealed this

Second Day of March, 2004

JON W. DUDAS
*Acting Director of the United States Patent and Trademark Office*